US008154359B2

(12) United States Patent
Endo

(10) Patent No.: US 8,154,359 B2

(45) Date of Patent: Apr. 10, 2012

(54) THIN FILM BALUN

(75) Inventor: Makoto Endo, Tokyo (JP)

(73) Assignee: TDK Corporation, Tokyo (JP)

( * ) Notice: Subject to any disclaimer, the term of this patent is extended or adjusted under 35 U.S.C. 154(b) by 317 days.

(21) Appl. No.: 12/588,206

(22) Filed: Oct. 7, 2009

(65) Prior Publication Data

US 2010/0109792 A1 May 6, 2010

(30) Foreign Application Priority Data

Oct. 31, 2008 (JP) ................................ 2008-281754

(51) Int. Cl.
*H03H 7/42* (2006.01)
*H01P 3/08* (2006.01)

(52) U.S. Cl. ......................................... 333/26; 222/238

(58) Field of Classification Search .................... 333/25, 333/26, 238
See application file for complete search history.

(56) References Cited

U.S. PATENT DOCUMENTS 6,628,189 B2 9/2003 Yazaki et al.
6,954,116 B2 10/2005 Nosaka
7,250,828 B2 * 7/2007 Erb ................................ 333/26
7,663,448 B2 * 2/2010 Harada et al. .................. 333/26
7,683,733 B2 * 3/2010 Li et al. ........................... 333/25
7,961,063 B2 * 6/2011 Liu et al. ......................... 333/26

FOREIGN PATENT DOCUMENTS

JP A-2004-274715 9/2004
JP B2-3800121 5/2006

* cited by examiner

*Primary Examiner* — Dean O Takaoka
(74) *Attorney, Agent, or Firm* — Oliff & Berridge, PLC

(57) ABSTRACT

The present invention provides a thin film balun includes: an unbalanced transmission line 2 including a first coil portion C1 and a second coil portion C2; a balanced transmission line 3 including a third coil portion C3 and a fourth coil portion C4 that are magnetically coupled to the first coil portion C1 and the second coil portion C2, respectively; a first balanced terminal T1 connected to the third coil portion C3; a second balanced terminal T2 connected to the fourth coil portion C4; and an auxiliary coil portion C5 provided between the third coil portion C3 and the first balanced terminal T1 and/or between the fourth coil portion C4 and the second balanced terminal T2.

3 Claims, 14 Drawing Sheets

THIN FILM BALUN

The entire disclosure of Japanese Patent Applications No. 2008-281754, filed Oct. 31, 2008, is expressly incorporated by reference herein.

BACKGROUND OF THE INVENTION

1. Field of the Invention

The present invention relates to a balun that performs conversion between unbalanced and balanced signals, and in particular relates to a thin film balun that is formed by a thin film process advantageous for smaller and thinner models.

2. Description of the Related Art

A wireless communication device includes various high frequency elements such as an antenna, a filter, an RF switch, a power amplifier, an RF-IC, and a balun. Of these elements, a resonant element such as an antenna or a filter handles an unbalanced signal which is based on a ground potential, whereas an RF-IC which generates or processes a high frequency signal handles a balanced signal. Accordingly, when connecting these two elements, a balun that functions as an unbalanced-balanced converter is used.

There is a tendency to require that a balun used for a wireless LAN or a mobile communication device such as a mobile phone has filter characteristics (attenuation characteristics) of attenuating desired frequencies. To impart such attenuation characteristics, a technique of providing a capacitor between a balanced terminal and a GND terminal or between an unbalanced terminal and a GND terminal of the balun is disclosed (for example, see Japanese Patent Application Laid-Open No. 2004-274715).

SUMMARY OF THE INVENTION

However, in the case of providing the capacitor by insertion, there are problems that sufficient attenuation characteristics cannot be attained and also a relatively large insertion loss arises. Besides, in the case of externally adding a filter in order to attain sufficient attenuation characteristics, there are disadvantages that an increase in the number of components runs counter to the demand for miniaturization and also the insertion loss further increases.

The present invention was conceived in view of the above-mentioned circumstances, and has an object of providing a thin film balun that has attenuation characteristics in a desired frequency range, while maintaining miniaturization.

To solve the stated problems, the thin film balun according to the present invention includes: an unbalanced transmission line including a first line portion and a second line portion; a balanced transmission line including a third line portion and a fourth line portion that are magnetically coupled to the first line portion and the second line portion, respectively; an unbalanced terminal connected to the first line portion; a first balanced terminal connected to the third line portion; a second balanced terminal connected to the fourth line portion; and an L component provided at least one of: between the third line portion and the first balanced terminal; and between the fourth line portion and the second balanced terminal.

According to this structure, by providing the L component between the third line portion and the first balanced terminal and/or between the fourth line portion and the second balanced terminal, the attenuation characteristics of the thin film balun can be adjusted. Here, the L component is assumed to be a line portion having a bend, though the L component is not limited so long as it is a line portion with a desired inductance. Moreover, the L component is preferably provided on a layer that is different from the first to fourth line portions constituting the unbalanced transmission line and the balanced transmission line.

Preferably, coils may be used as the above-mentioned line portions and L component. In this case, the thin film balun according to the present invention includes: an unbalanced transmission line including a first coil portion and a second coil portion; a balanced transmission line including a third coil portion and a fourth coil portion that are magnetically coupled to the first coil portion and the second coil portion, respectively; a first balanced terminal connected to the third coil portion; a second balanced terminal connected to the fourth coil portion; and an auxiliary coil portion provided at least one of: between the third coil portion and the first balanced terminal; and between the fourth coil portion and the second balanced terminal.

Preferably, at least one part of the auxiliary coil portion is positioned so as to face a coil opening of at least one of the first coil portion and the second coil portion. For example, the auxiliary coil portion is connected between the fourth coil portion and the second balanced terminal. Preferably, a winding direction of the auxiliary coil portion is opposite to a winding direction of the first coil portion and the second coil portion. It has been confirmed by the inventors of the present application that these structures enable the attenuation characteristics of the thin film balun to be adjusted, though detailed functions are unclear.

According to the present invention, by adding the L component between the third line portion and the first balanced terminal and/or between the fourth line portion and the second balanced terminal, a thin film balun having desired attenuation characteristics can be reliably obtained by a simple structure.

DESCRIPTION OF THE PREFERRED EMBODIMENTS

Figure 1:
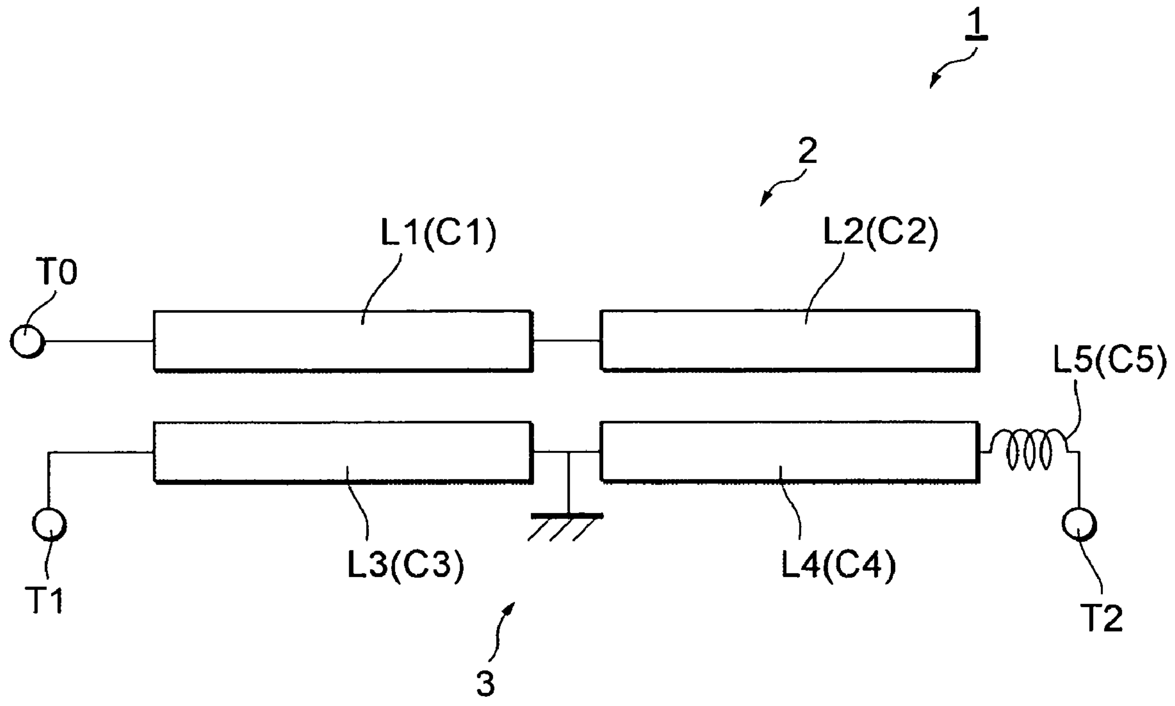
FIG. 1 is an equivalent circuit diagram of a thin film balun 1 according to an embodiment of the present invention.

The following describes an embodiment of the present invention with reference to drawings. Note that the same components in the drawings are given the same reference signs, and repeated description is omitted. Moreover, the positional relationships such as up, down, left, and right are based on the positional relationships shown in the drawings, unless otherwise specified. Furthermore, scale ratios of the drawings are not limited to the illustrated ratios. Note also that the following embodiment is merely an example for describing the present invention, and the present invention is not limited only to the embodiment. Various changes can be made to the present invention without departing from the scope of the present invention.

FIG. 1 is an equivalent circuit diagram of a thin film balun 1 according to this embodiment.

As shown in FIG. 1, the thin film balun 1 has an unbalanced transmission line 2 including a first line portion L1 and a second line portion L2, and a balanced transmission line 3 including a third line portion L3 and a fourth line portion L4 that are magnetically coupled to the first line portion L1 and the second line portion L2, respectively. The thin film balun 1 also has an unbalanced terminal T0 connected to the first line portion L1, a first balanced terminal T1 connected to the third line portion L3, and a second balanced terminal T2 connected to the fourth line portion L4. Furthermore, an L component L5 is provided between the fourth line portion L4 and the second balanced terminal T2.

The connection relationships are explained in more detail below. The first line portion L1 and the second line portion L2 are connected in series with the unbalanced terminal TO, where an opposite side of the second coil portion to the first coil portion is terminated. Meanwhile, the third line portion L3, the fourth line portion L4, and the L component L5 are connected in series between the first balanced terminal T1 and the second balanced terminal T2. A connecting point between the third line portion L3 and the fourth line portion L4 is fixed at a ground potential.

Lengths of the above-mentioned line portions L1 to L4 change depending on specifications of the thin film balun, but are set so as to form a quarter-wavelength resonator circuit of a signal which is subject to conversion. Shapes of the line portions L1 to L4 are arbitrary, and may be any of a spiral, a zigzag, and a straight line. The L component L5 is not limited so long as it is a line portion with a desired inductance. To distinguish from length adjustments of mere line portions, however, the L component L5 is assumed to be a line portion having a bend.

A basic operation of the thin film balun 1 is described below, with reference to FIG. 1.

In the thin film balun 1 described above, when an unbalanced signal is input in the unbalanced terminal T0, the unbalanced signal propagates through the first line portion L1 and the second line portion L2. Due to the magnetic coupling of the first line portion L1 with the third line portion L3 and the magnetic coupling of the second line portion L2 with the fourth line portion L4, the unbalanced signal is converted to two balanced signals whose phases are different by 180°, and the two balanced signals are output from the first balanced terminal T1 and the second balanced terminal T2. A converting operation from balanced signals to an unbalanced signal is the reverse of the above-mentioned operation.

In the thin film balun 1 described above, there is a case where attenuation of a desired harmonic such as a second-order harmonic of a signal to be converted is required. In this embodiment, the L component L5 is inserted between the fourth line portion L4 and the second balanced terminal T2, in order to achieve harmonic attenuation. The following describes examples of the thin film balun when using coil portions as the line portions L1 to L4.

EXAMPLE 1

Figure 2:
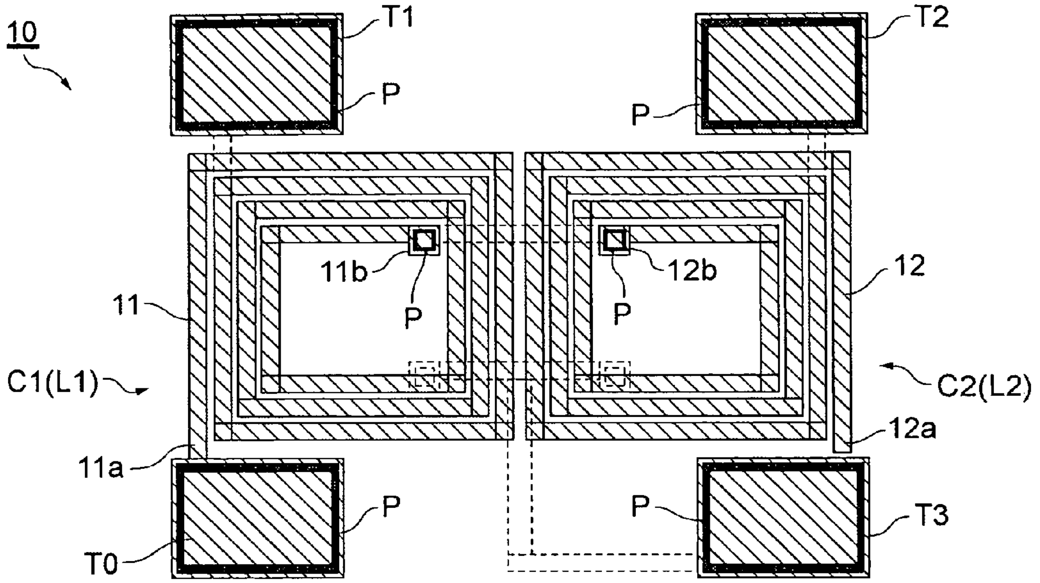
FIG. 2 is a plan view showing a first wiring layer 10 of the thin film balun 1.
Figure 3:
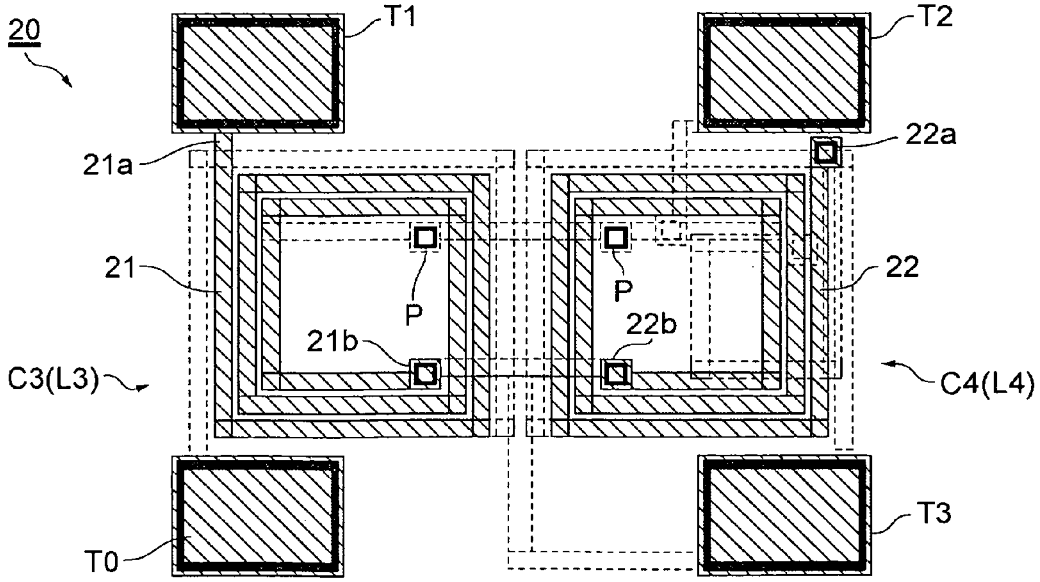
FIG. 3 is a plan view showing a second wiring layer 20 of the thin film balun 1.
Figure 4:
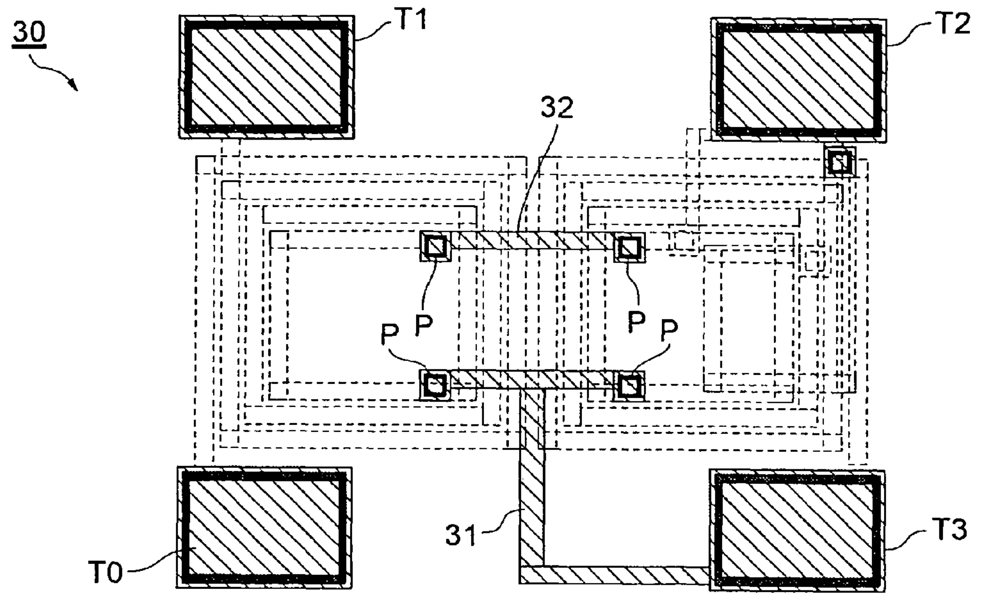
FIG. 4 is a plan view showing a third wiring layer 30 of the thin film balun 1.
Figure 5:
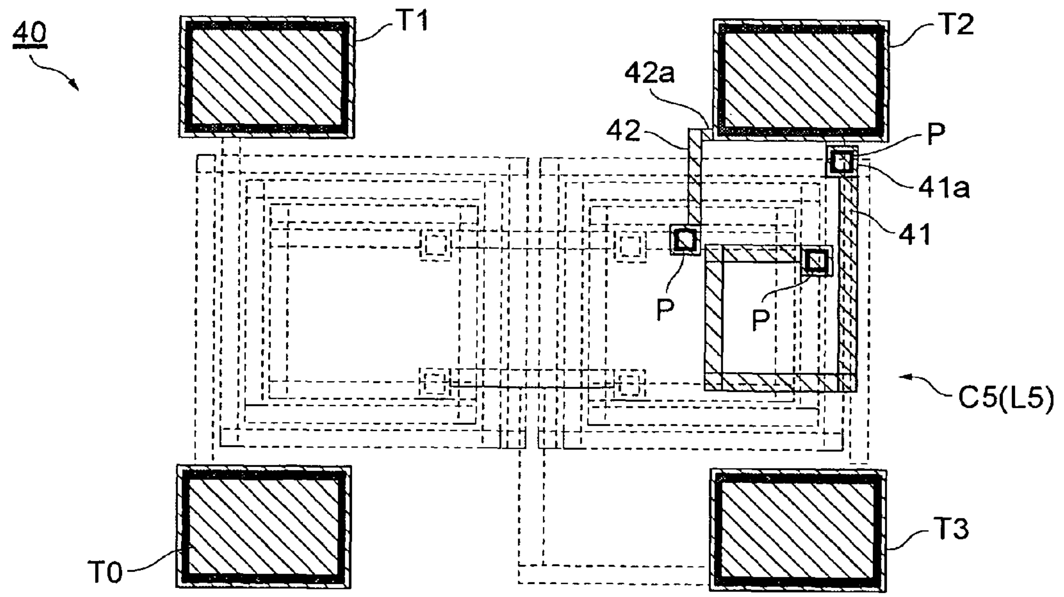
FIG. 5 is a plan view showing a fourth wiring layer 40 of the thin film balun 1.
Figure 6:
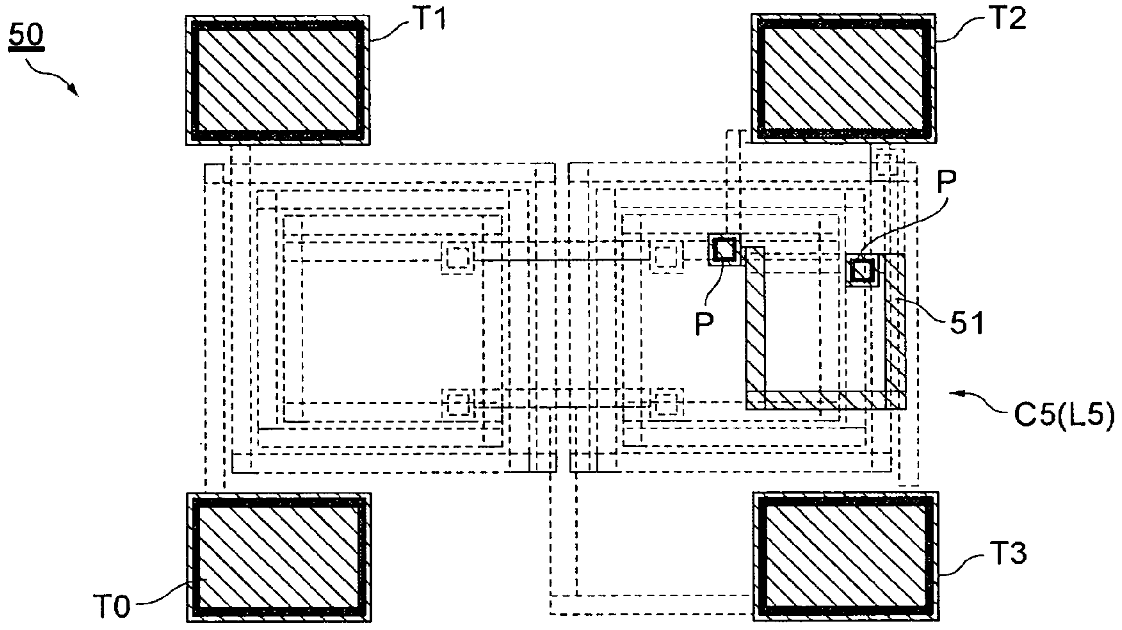
FIG. 6 is a plan view showing a fifth wiring layer 50 of the thin film balun 1.

FIGS. 2 to 6 are a plan view of each wiring layer of the thin film balun 1 in the example 1. In detail, FIG. 2 is a plan view of a first wiring layer 10, FIG. 3 is a plan view of a second wiring layer 20, FIG. 4 is a plan view of a third wiring layer 30, FIG. 5 is a plan view of a fourth wiring layer 40, and FIG. 6 is a plan view of a fifth wiring layer 50. The first wiring layer 10 is a lowermost wiring layer, and the fifth wiring layer 50 is an uppermost wiring layer. A substrate is located under the first wiring layer 10 which is the lowermost layer, though not shown in the drawings. That is, the thin film balun is formed on the substrate.

As shown in FIGS. 2 to 6, the unbalanced terminal T0, the first balanced terminal T1, the second balanced terminal T2, and a ground terminal T3 are formed on all layers of the first wiring layer 10 to the fifth wiring layer 50. Each of the terminals T0 to T3 is electrically connected between different layers via a through hole P. Note that all through holes P shown in FIGS. 2 to 6 are electroplated for electrical conduction of upper and lower layers. A structure of each wiring layer is described in detail below.

As shown in FIG. 2, a first coil portion C1 and a second coil portion C2 which constitute the unbalanced transmission line 2 are formed adjacent to each other on the first wiring layer 10. Each of the coil portions C1 and C2 forms an equivalent of a quarter-wavelength resonator. An outer end 11*a* of a coil conductor 11 constituting the first coil portion C1 is connected to the unbalanced terminal TO, and an inner end 11*b* of the coil conductor 11 is connected to a through hole P. An inner end 12*b* of a coil conductor 12 constituting the second coil portion C2 is connected to a through hole P, and an outer end 12*a* of the coil conductor 12 is open.

As shown in FIG. 3, a third coil portion C3 and a fourth coil portion C4 which constitute the balanced transmission line 3 are formed adjacent to each other on the second wiring layer 20. Each of the coil portions C3 and C4 forms an equivalent of a quarter-wavelength resonator. The coil portions C3 and C4 of the balanced transmission line 3 are placed so as to face the coil portions C1 and C2 of the unbalanced transmission line 2 respectively, and the facing portions are magnetically coupled to form couplers. An outer end 21*a* of a coil conductor 21 constituting the third coil portion C3 is connected to the first balanced terminal T1, and an inner end 21*b* of the coil conductor 21 is connected to a through hole P. An outer end 22*a* and an inner end 22*b* of a coil conductor 22 constituting the fourth coil portion C4 are each connected to a through hole P.

As shown in FIG. 4, a wire 31 for electrically connecting the third coil portion C3 and the fourth coil portion C4 to the ground terminal T3 and a wire 32 for electrically connecting the first coil portion C1 and the second coil portion C2 are formed on the third wiring layer 30. The wire 31 has a shape that branches so as to connect two through holes P to the ground terminal T3. The wire 31 is connected to the end 21*b* of the coil conductor 21 and the end 22*b* of the coil conductor 22, via the two through holes P. The wire 32 is connected to the end 11*b* of the coil conductor 11 and the end 12*b* of the coil conductor 12, via through holes P.

As shown in FIG. 5, coil conductors 41 and 42 that constitute a part of an auxiliary coil portion C5 are formed on the fourth wiring layer 40. One end 42*a* of the coil conductor 42 is connected to the second balanced terminal T2, and one end 41*a* of the coil conductor 41 is connected to the end 22*a* of the coil conductor 22 constituting the fourth coil portion C4 via a through hole P.

As shown in FIG. 6, a coil conductor 51 that constitutes a part of the auxiliary coil portion C5 is formed on the fifth wiring layer 50. Ends of the coil conductor 51 are each connected to a different one of the other ends of the coil conductors 41 and 42.

As shown in FIGS. 5 and 6, the auxiliary coil portion C5 is formed by connecting the coil conductor 42, the coil conductor 51, and the coil conductor 41 via through holes. The end 42*a* of the coil conductor 42, which is one end of the auxiliary coil portion C5, is connected to the second balanced terminal T2, and the end 41*a* of the coil conductor 41, which is the other end of the auxiliary coil portion C5, is connected to the coil conductor 22 of the fourth coil portion C4.

The above describes the example where, to the thin film balun structure in which the two coils C1 and C2 constituting the unbalanced transmission line are formed on the same first layer, the two coils C3 and C4 constituting the balanced transmission line are formed on the second layer that is another layer adjacent to the first layer, and the wire connecting the coils C1 and C2 and the wire connecting the coils C3 and C4 are formed on the third layer that is adjacent to the second layer on an opposite side to the first layer, the auxiliary coil C5 is additionally formed using the two layers, namely, the fourth layer that is adjacent to the third layer on an opposite side to the second layer and the fifth layer that is adjacent to the fourth layer on an opposite side to the third layer. However, the auxiliary coil may instead be formed using the third layer and the fourth layer. This changes a magnetic coupling state, as a result of which further improvements of characteristics can be expected.

Needless to say, the auxiliary coil is not limited to two layers, and may be formed on only one layer such as the fourth layer or the third layer. Design can be made according to desired characteristics.

As described above, the thin film balun 1 of the example 1 includes the auxiliary coil portion C5 between the fourth line portion L4 and the second balanced terminal T2. A result of evaluating attenuation characteristics of the thin film balun 1 of the example 1 is described below, together with attenuation characteristics of a comparative example.

COMPARATIVE EXAMPLE

Figure 7:
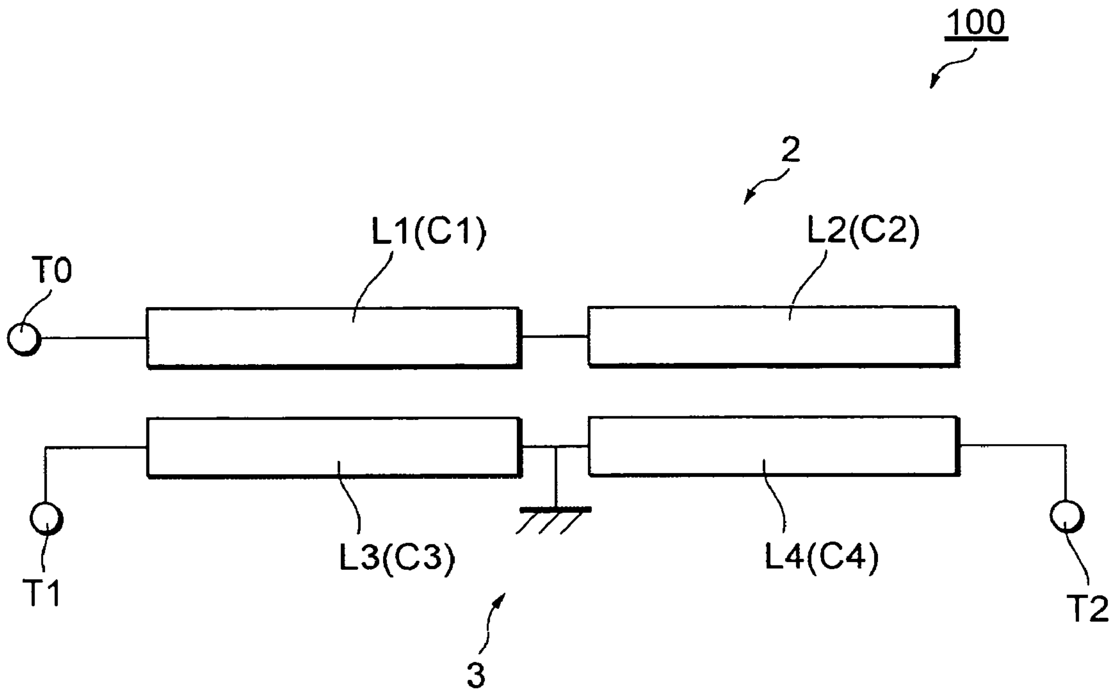
FIG. 7 is an equivalent circuit diagram of a thin film balun 100 in a comparative example.

FIG. 7 is an equivalent circuit diagram of a thin film balun of the comparative example as a reference for comparison. A thin film balun 100 of the comparative example does not have the L component L5 between the fourth coil portion C4 and the second balanced terminal T2. In detail, the thin film balun of the comparative example has a structure in which the end 22*a* of the coil conductor 22 of the second wiring layer 20 shown in FIG. 3 is connected to the second balanced terminal T2, and the coil conductors 41, 42, and 51 of the fourth wiring layer 40 and the fifth wiring layer 50 shown in FIGS. 5 and 6 are omitted.

(Evaluation Results)

Figure 8:
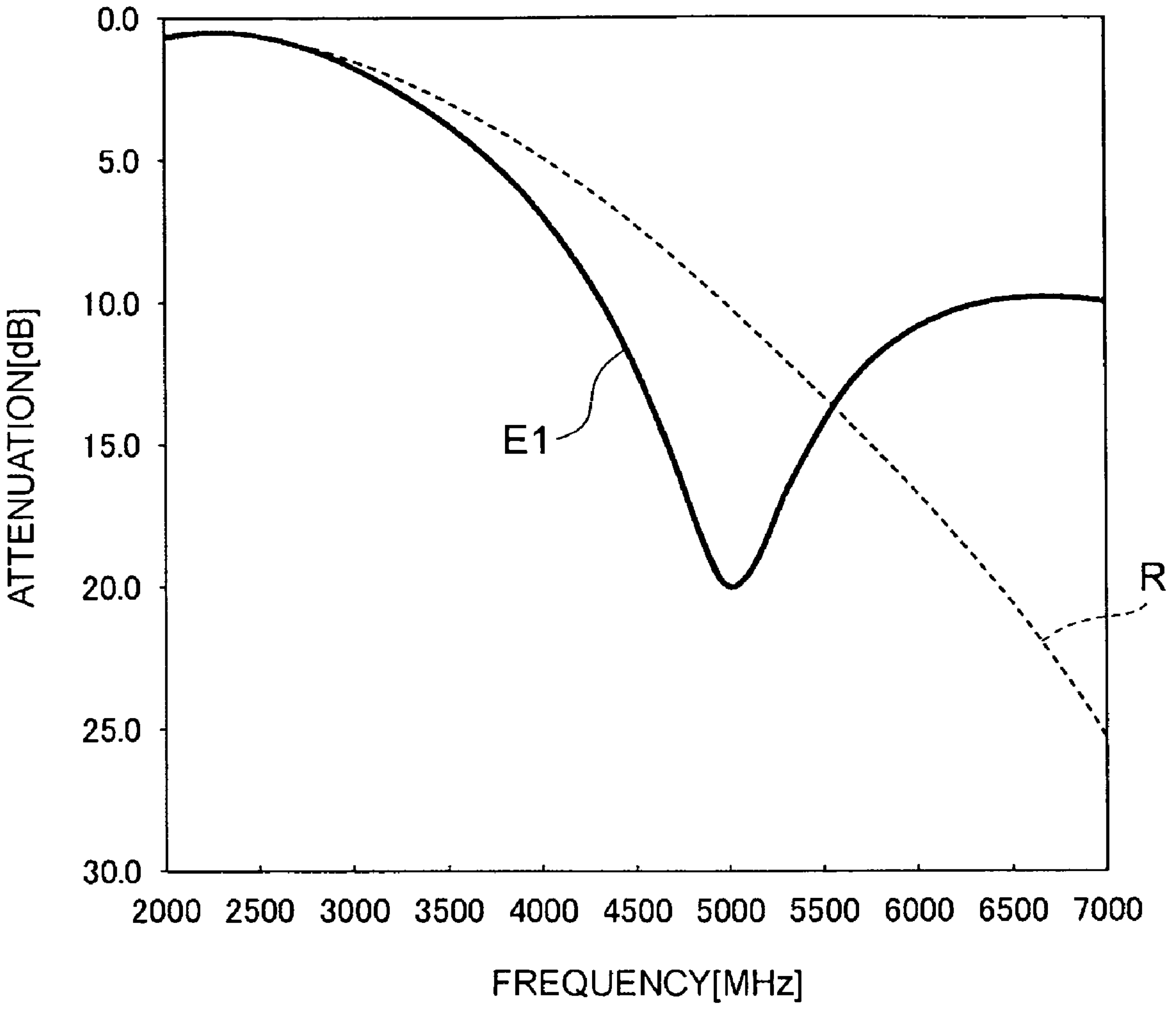
FIG. 8 is a diagram showing measurement results of attenuation characteristics in an example 1 and the comparative example.

Signal attenuation characteristics of the above-mentioned structures of the example 1 and the comparative example were evaluated by simulation. Target signal frequencies were set at 2400 MHz to 2500 MHz. The results are shown in FIG. 8. In FIG. 8, E1 indicates the result of the example 1, and R indicates the result of the comparative example.

As shown in FIG. 8, in the thin film balun of the example 1, a large notch (attenuation peak) appeared in a frequency range including a second-order harmonic (4800 MHz in frequency) of the target signal frequencies. In the comparative example, on the other hand, such a notch did not appear in the frequency range including the second-order harmonic.

Thus, by providing the auxiliary coil portion C5 between the fourth coil portion C4 and the second balanced terminal T2, large attenuation characteristics can be obtained in a harmonic range of a signal which is subject to conversion.

A reason why such attenuation characteristics can be obtained is examined below. Signal transmission characteristics in a thin film balun are expressed by the following formula. In the following formula, f denotes a resonant frequency of a passing signal, L denotes an inductance, and C denotes a capacitance.

$$f = \frac{1}{2\pi\sqrt{LC}}$$

Thus, the transmission characteristics are affected by the inductance and the capacitance, so that the attenuation characteristics are equally affected by these components. Here, the auxiliary coil portion C5 inserted in the example 1 affects the inductance. In other words, the insertion of a line portion (L component) having a desired inductance other than a coiled line portion equally affects the attenuation characteristics. In addition, the position of inserting the L component is not limited to between the fourth line portion L4 and the second balanced terminal T2. The L component may instead be inserted between the third line portion L3 and the first balanced terminal T1, or may be inserted both between the fourth line portion L4 and the second balanced terminal T2 and between the third line portion L3 and the first balanced terminal T1.

Based on the above-mentioned result of the example, the structure for realizing a thin film balun having attenuation characteristics can be extended or generalized to the structure of the thin film balun 1 in which the L component is provided at least one of: between the third line portion L3 and the first balanced terminal T1; and between the fourth line portion L4 and the second balanced terminal T2.

The following describes how the attenuation characteristics of the thin film balun 1 are affected when the shape of the auxiliary coil portion C5 is changed in order to change its inductance, using examples 2 to 4.

EXAMPLE 2

Figure 9:
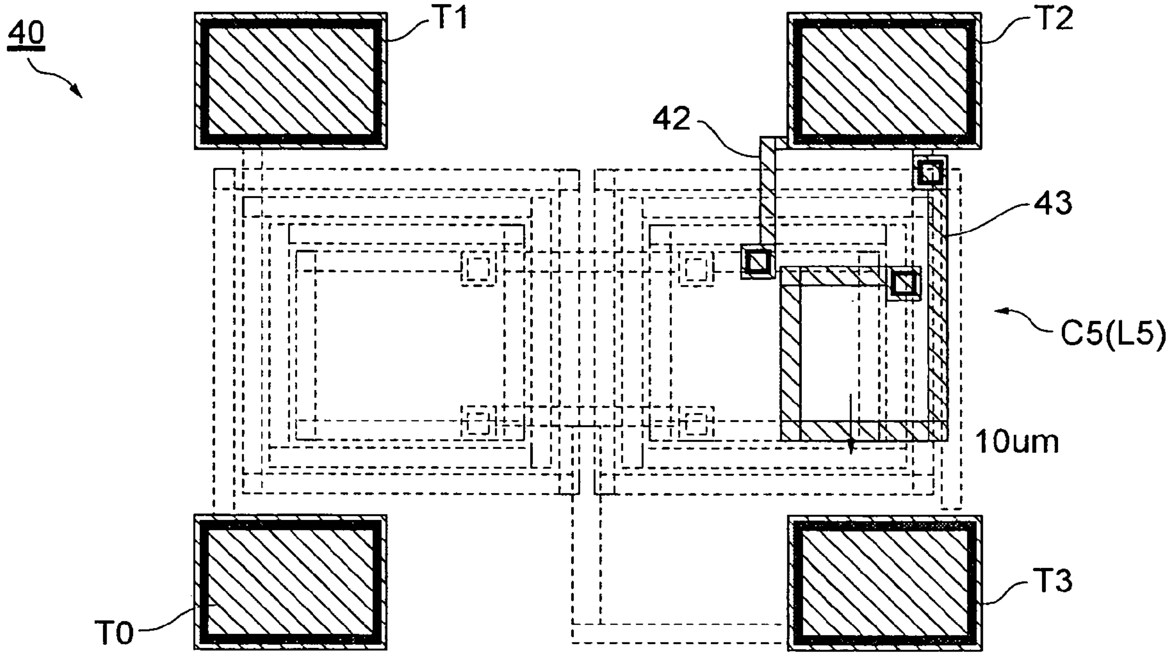
FIG. 9 is a plan view showing the fourth wiring layer 40 of the thin film balun 1 in an example 2.
Figure 10:
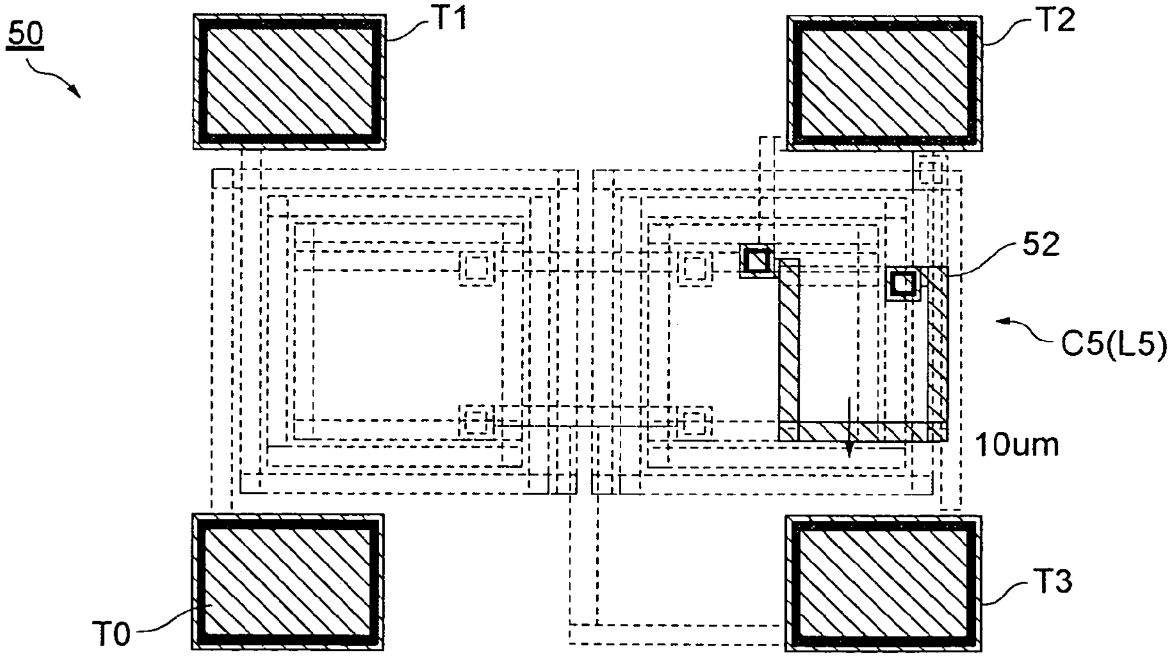
FIG. 10 is a plan view showing the fifth wiring layer 50 of the thin film balun 1 in the example 2.

In the example 2, coil conductors are lengthened as compared with the example 1, thereby increasing the inductance of the auxiliary coil portion C5. FIGS. 9 and 10 are plan views respectively showing the fourth wiring layer 40 and the fifth wiring layer 50 of the thin film balun 1 in the example 2. Note that the first wiring layer 10 to the third wiring layer 30 of the thin film balun 1 in the example 2 have the same structures as the example 1.

As shown in FIGS. 9 and 10, coil conductors 43 and 52 constituting the auxiliary coil portion C5 of the example 2 are respectively obtained by extending the coil conductors 41 and 51 of the example 1 downward in the drawing by 10 μm, as a result of which the inductance of the auxiliary coil portion C5 is increased.

EXAMPLE 3

Figure 11:
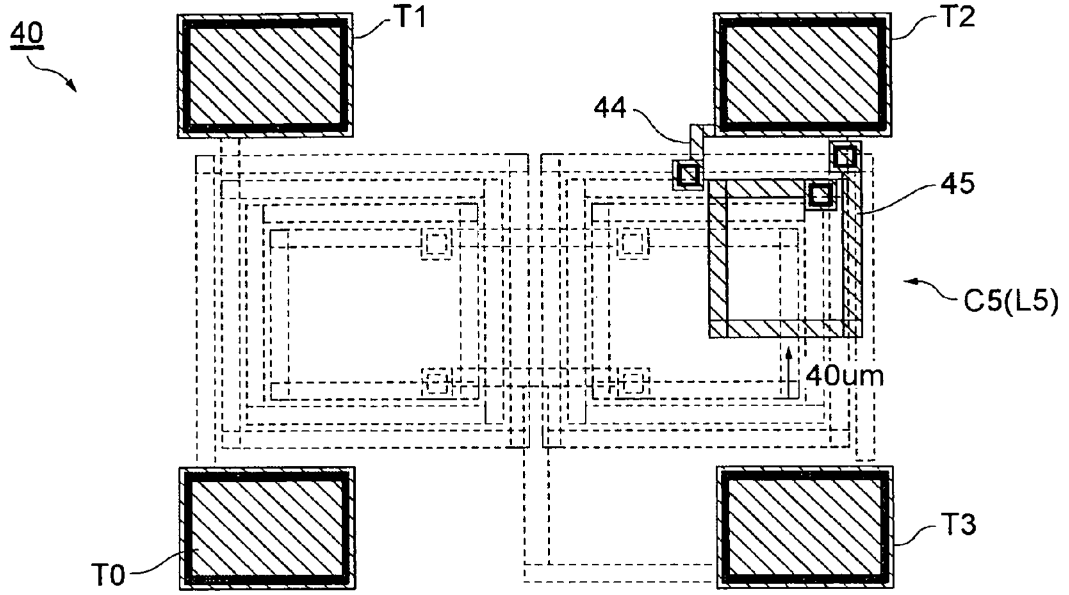
FIG. 11 is a plan view showing the fourth wiring layer 40 of the thin film balun 1 in an example 3.
Figure 12:
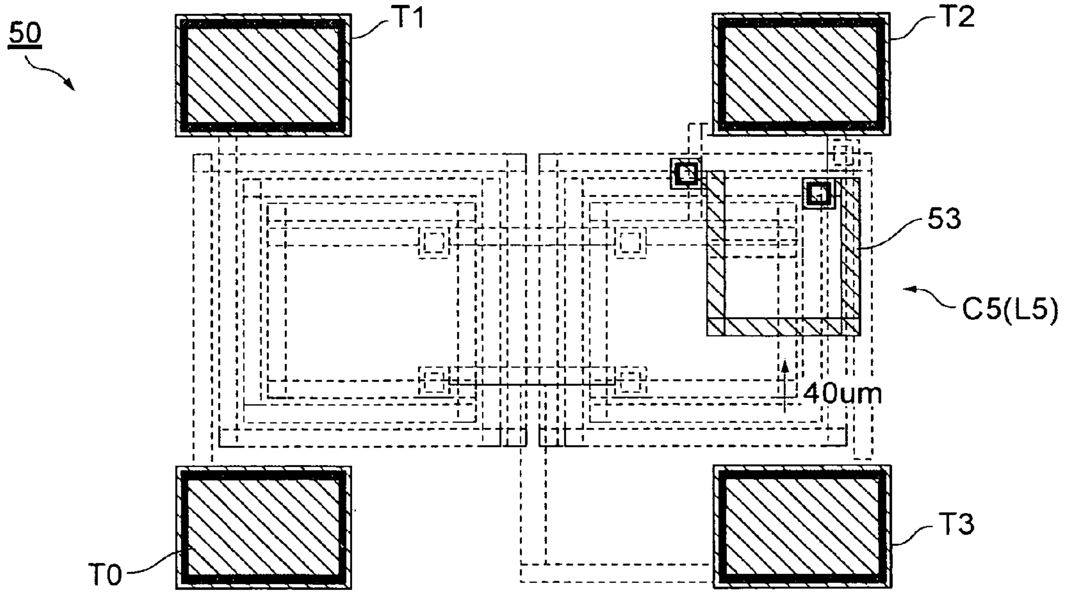
FIG. 12 is a plan view showing the fifth wiring layer 50 of the thin film balun 1 in the example 3.

In the example 3, coil conductors are shortened as compared with the example 1, thereby decreasing the inductance of the auxiliary coil portion C5. FIGS. 11 and 12 are plan views respectively showing the fourth wiring layer 40 and the fifth wiring layer 50 of the thin film balun 1 in the example 3. Note that the first wiring layer 10 to the third wiring layer 30 of the thin film balun 1 in the example 3 have the same structures as the example 1. As shown in FIGS. 11 and 12, coil conductors 44, 45, and 53 constituting the auxiliary coil portion C5 of the example 3 are obtained by shortening the coil conductors 42, 41, and 51 of the example 1 upward in the drawing by 40 μm, as a result of which the inductance of the auxiliary coil portion C5 is decreased.

EXAMPLE 4

Figure 13:
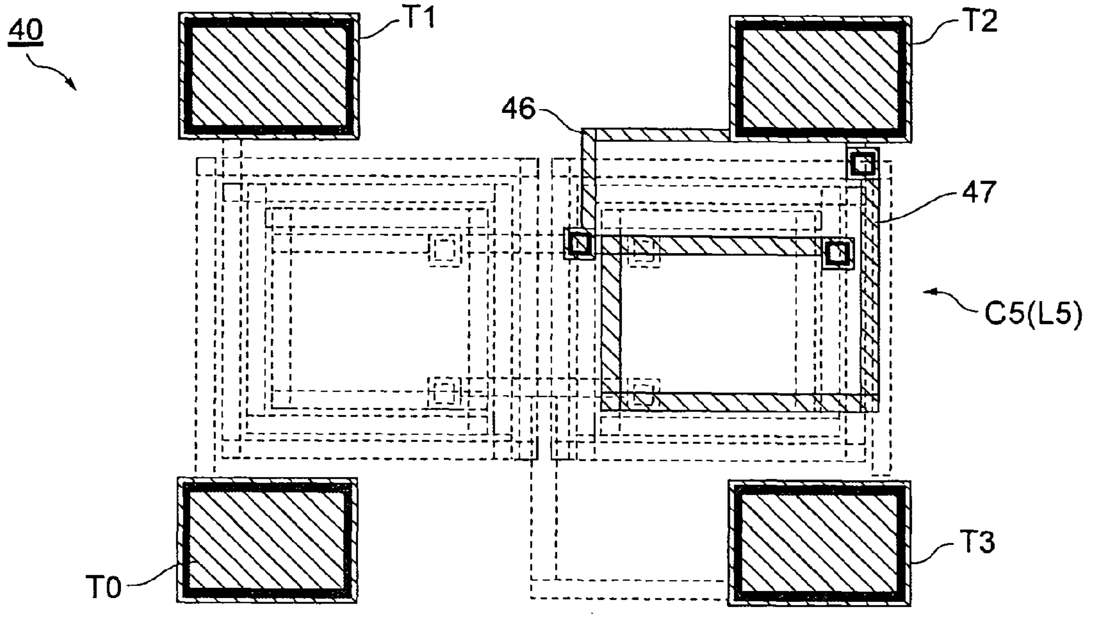
FIG. 13 is a plan view showing the fourth wiring layer 40 of the thin film balun 1 in an example 4.
Figure 14:
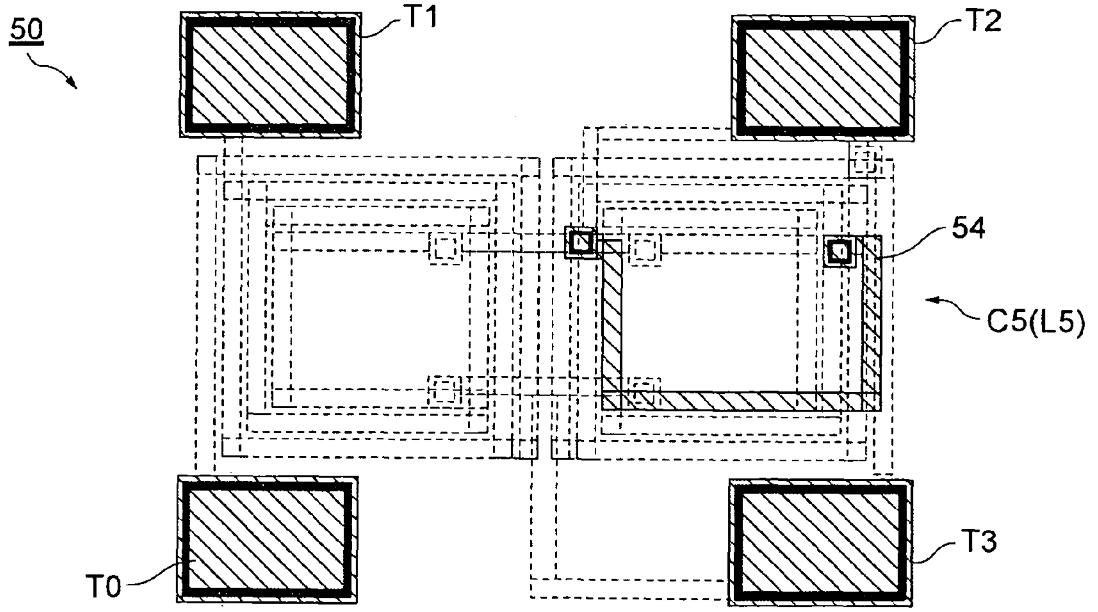
FIG. 14 is a plan view showing the fifth wiring layer 50 of the thin film balun 1 in the example 4.

In the example 4, a coil opening of the auxiliary coil portion C5 is widened as compared with the example 1, thereby increasing an area in which the auxiliary coil portion C5 overlaps a coil opening of the second coil portion C2. FIGS. 13 and 14 are plan views respectively showing the fourth wiring layer 40 and the fifth wiring layer 50 of the thin film balun 1 in the example 4. Note that the first wiring layer 10 to the third wiring layer 30 of the thin film balun 1 in the example 4 have the same structures as the example 1. As shown in FIGS. 13 and 14, coil conductors 46, 47, and 54 constituting the auxiliary coil portion C5 of the example 4 are obtained by significantly widening the coil conductors 42, 41, and 51 of the example 1 outward, as a result of which the area in which the auxiliary coil portion C5 overlaps the coil opening of the second coil portion C2 is increased. The auxiliary coil portion C5 mentioned here denotes a portion that includes both the coil conductors and the coil opening.

(Evaluation Results)

Figure 15:
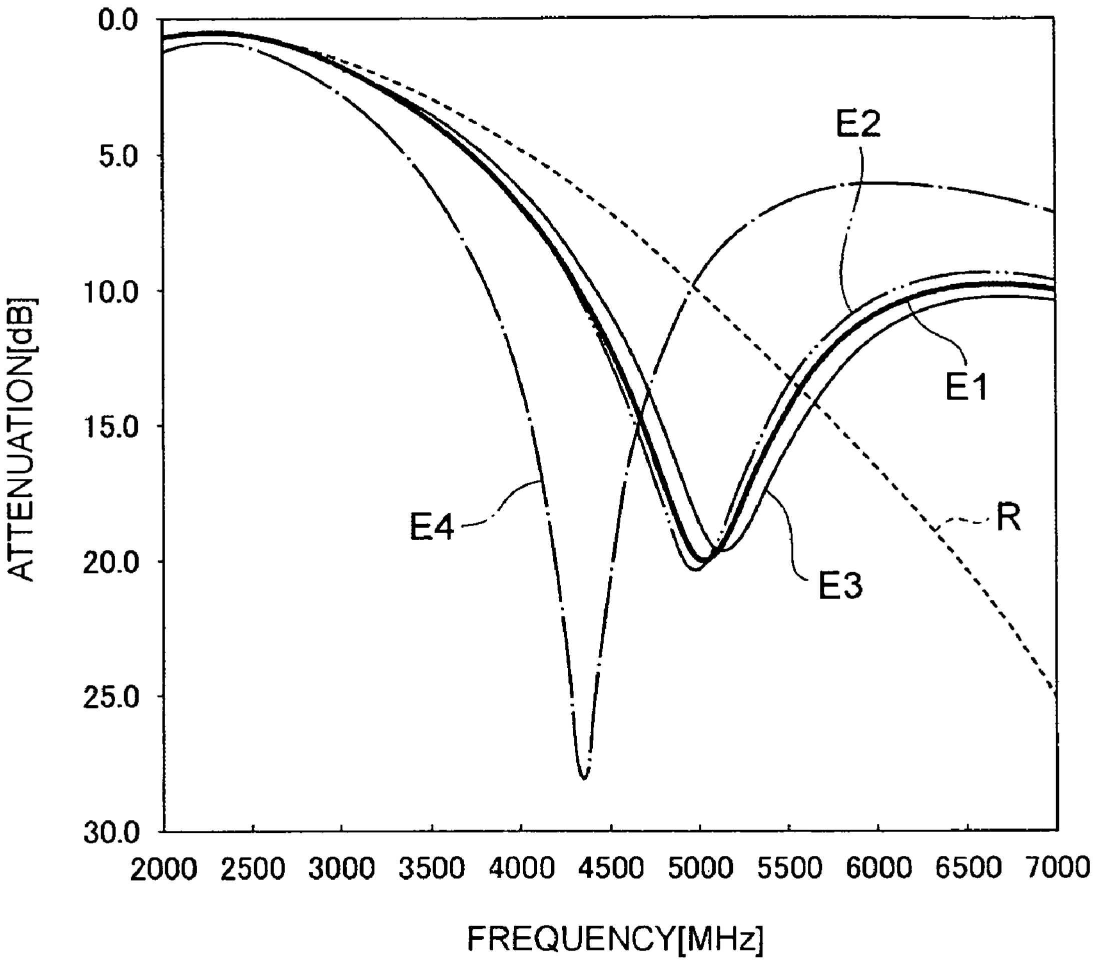
FIG. 15 is a diagram showing measurement results of attenuation characteristics in the examples 1 to 4 and the comparative example.

Signal attenuation characteristics of the above-mentioned structures of the examples 2 to 4 were evaluated by simulation. Target signal frequencies were set at 2400 MHz to 2500 MHz. The results are shown in FIG. 15. In FIG. 15, E2 indicates the result of the example 2, E3 indicates the result of the example 3, and E4 indicates the result of the example 4. The result (E1) of the example 1 and the result (R) of the comparative example are shown in FIG. 15, too.

As shown in FIG. 15, by changing the shape of the auxiliary coil portion C5, the signal frequency which is attenuated and the attenuation of that signal frequency are changed. Therefore, the shape of the auxiliary coil portion C5 can be changed so as to obtain an optimum attenuation peak according to the specifications of the thin film balun 1. As seen from the results shown in FIG. 15, large attenuation can be attained by disposing the auxiliary coil portion C5 so as to face or overlap the second coil portion C2. This is probably because, when the auxiliary coil portion C5 is disposed so as to face or overlap the second coil portion C2, a magnetic flux generated by a current flowing through the second coil portion C2 and a magnetic flux generated by a current flowing through the auxiliary coil portion C5 interfere with each other, which causes a large attenuation peak to appear in a specific frequency range.

EXAMPLE 5

Figure 16:
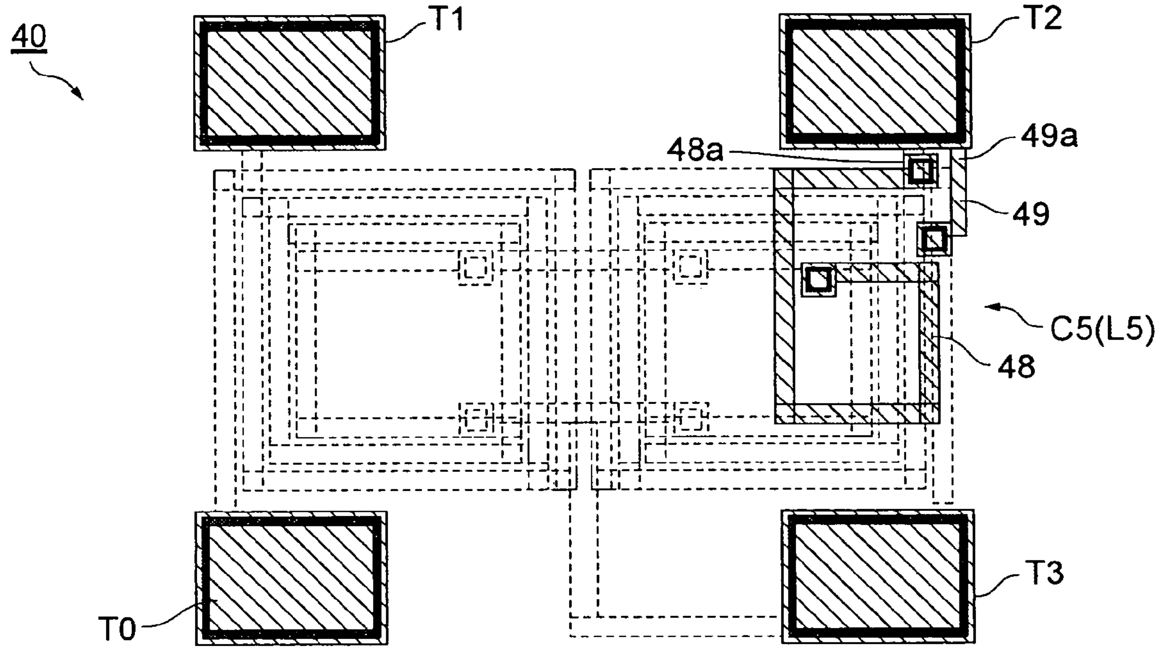
FIG. 16 is a plan view showing the fourth wiring layer 40 of the thin film balun 1 in an example 5.
Figure 17:
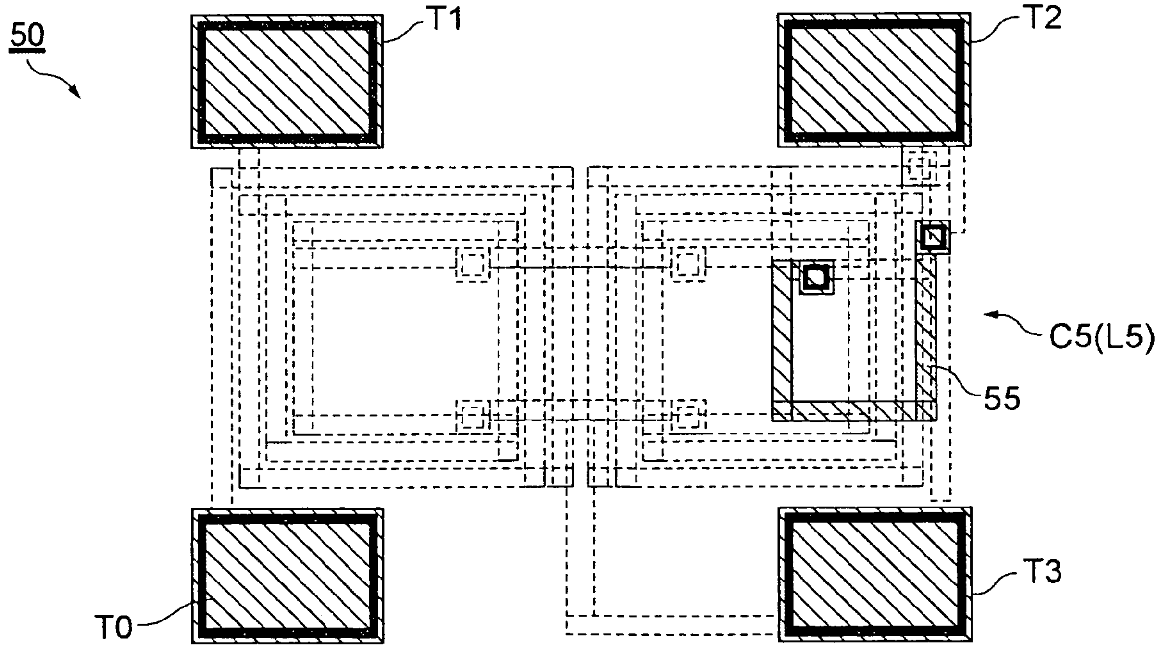
FIG. 17 is a plan view showing the fifth wiring layer 50 of the thin film balun 1 in the example 5.

In the example 5, a winding direction of the auxiliary coil portion C5 is reversed as compared with the example 1. FIGS. 16 and 17 are plan views respectively showing the fourth wiring layer 40 and the fifth wiring layer 50 of the thin film balun 1 in the example 5. Note that the first wiring layer 10 to the third wiring layer 30 of the thin film balun 1 in the example 5 have the same structures as the example 1. As shown in FIGS. 16 and 17, the winding direction of the auxiliary coil portion C5 constituted by coil conductors 48, 49, and 55 of the example 5 is opposite to a winding direction of the second coil portion C2 (see FIG. 2). Here, the winding direction of the coil portion in the unbalanced transmission line 2 is determined by using the unbalanced terminal T0 as a start point, and the winding direction of the coil portion in the balanced transmission line 3 is determined by using the first balanced terminal T1 as a start point, when the thin film balun 1 is viewed from above the substrate. In this case, the first coil portion C1 and the second coil portion C2 are right-handed (clockwise), the third coil portion C3 and the fourth coil portion C4 are left-handed (counterclockwise), and the auxiliary coil portion C5 is left-landed. Hence the winding direction of the auxiliary coil portion C5 is opposite to that of the second coil portion C2 constituting the unbalanced transmission line 2.

(Evaluation Results)

Figure 18:
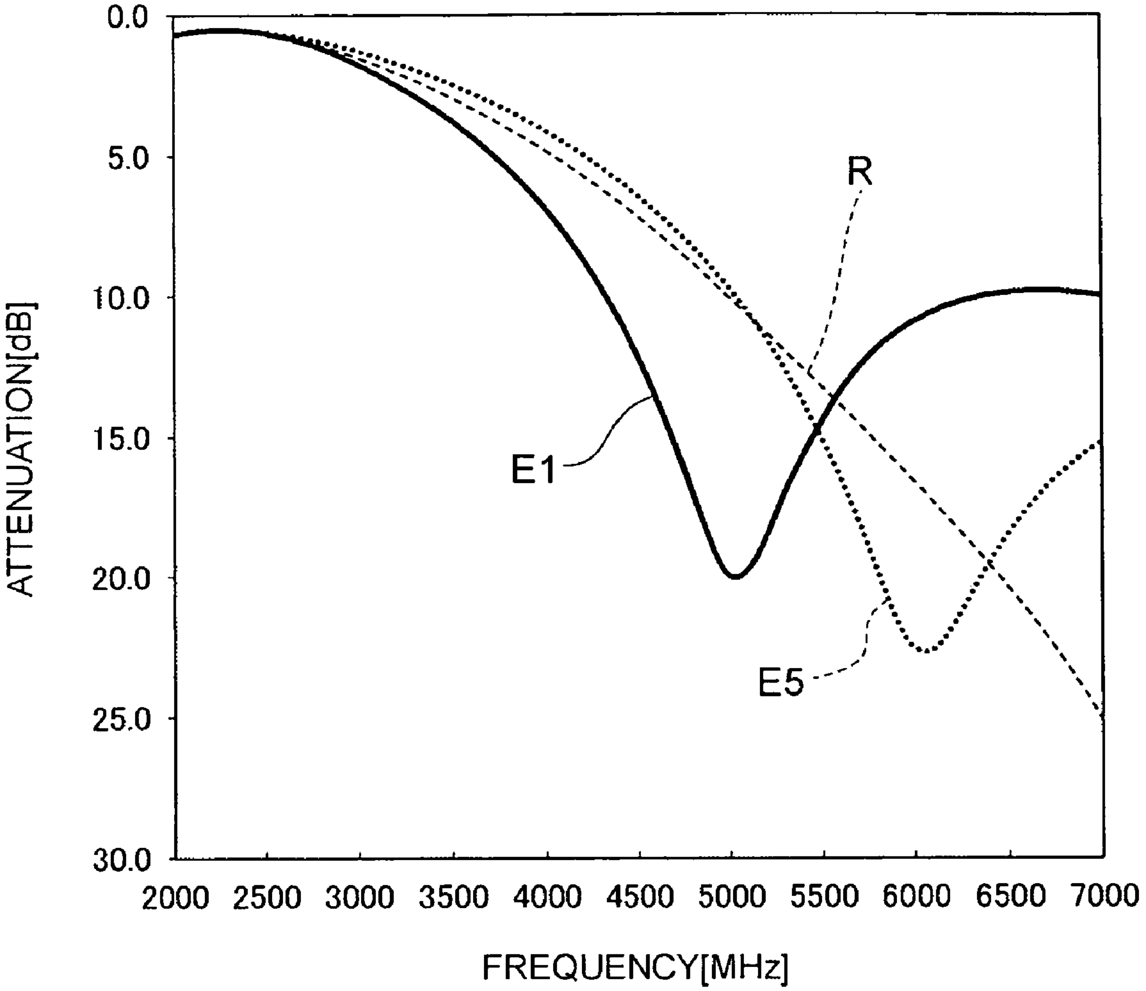
FIG. 18 is a diagram showing measurement results of attenuation characteristics in the examples 1 and 5 and the comparative example.

Signal attenuation characteristics of the above-mentioned structure of the example 5 were evaluated by simulation. Target signal frequencies were set at 2400 MHz to 2500 MHz. The results are shown in FIG. 18. In FIG. 18, E5 indicates the result of the example 5, E1 indicates the result of the example 1, and R indicates the result of the comparative example.

As shown in FIG. 18, by changing the winding direction of the auxiliary coil portion C5, the signal frequency which is attenuated and the attenuation of that signal frequency are changed. As seen from the results shown in FIG. 18, large attenuation as compared with the example 1 can be attained by setting the winding direction of the auxiliary coil portion C5 to be opposite to that of the second coil portion C2. This is probably because, when the winding direction of the auxiliary coil portion C5 is opposite to that of the second coil portion C2, a vector of a magnetic flux generated by a current flowing through the second coil portion C2 and a vector of a magnetic flux generated by a current flowing through the auxiliary coil portion C5 are opposite in direction, which weakens the magnetic coupling of the entire balanced-unbalanced circuit and as a result causes the resonant characteristics, i.e., the attenuation peak, to move toward higher frequencies and also increase.

EXAMPLE 6

Figure 19:
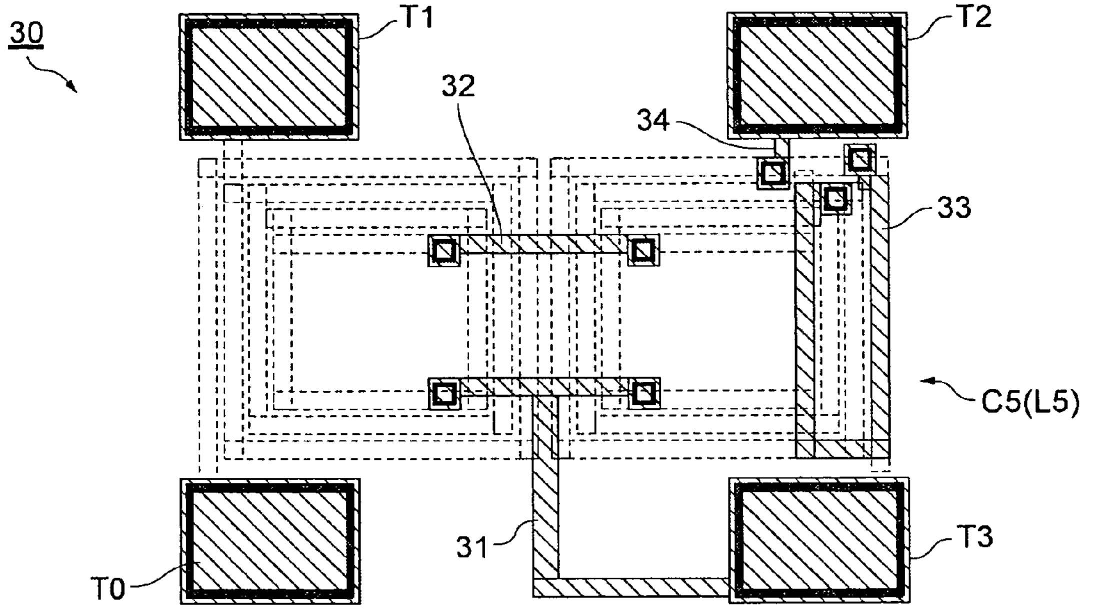
FIG. 19 is a plan view showing the third wiring layer 30 of the thin film balun 1 in an example 6.
Figure 20:
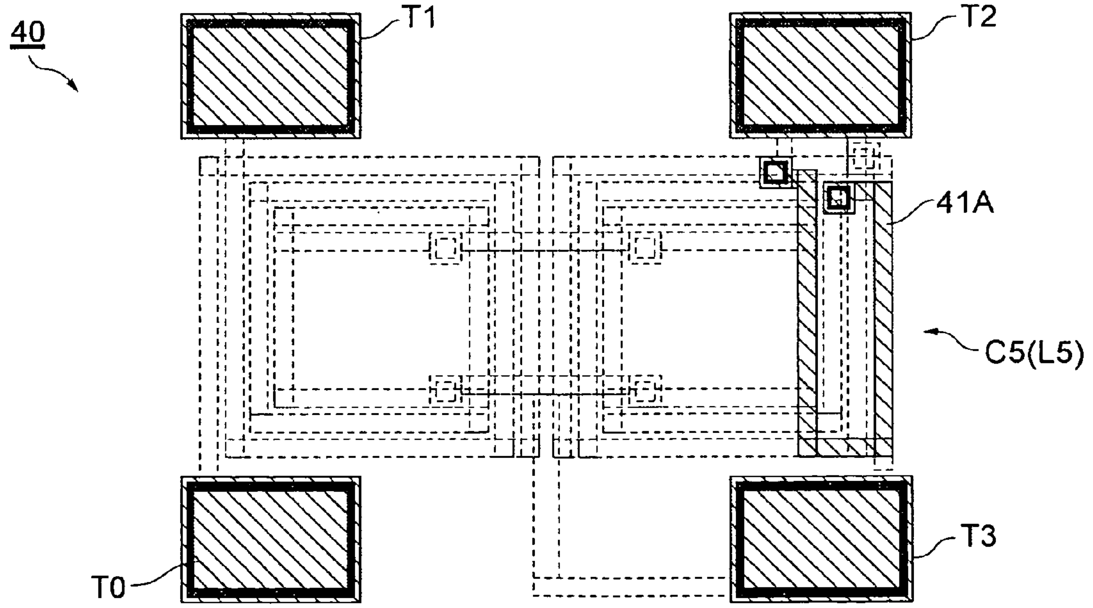
FIG. 20 is a plan view showing the fourth wiring layer 40 of the thin film balun 1 in the example 6.

In the example 6, the auxiliary coil portion C5 is formed by the third wiring layer 30 and the fourth wiring layer 40. FIGS. 19 and 20 are plan views respectively showing the third wiring layer 30 and the fourth wiring layer 40 of the thin film balun 1 in the example 6. Note that the first wiring layer 10 to the second wiring layer 20 of the thin film balun 1 in the example 6 have the same structures as the example 1. Besides, the fifth wiring layer 50 of the example 1 is unnecessary in the example 6. As shown in FIGS. 19 and 20, the auxiliary coil portion C5 is constituted by coil conductors 33, 34, and 41A of the third wiring layer 30 and the fourth wiring layer 40. Thus, the wiring layer of the auxiliary coil portion C5 is not specifically limited, so long as the auxiliary coil portion C5 is formed on a wiring layer different from the first coil portion C1 to the fourth coil portion C4.

EXAMPLE 7

Figure 21:
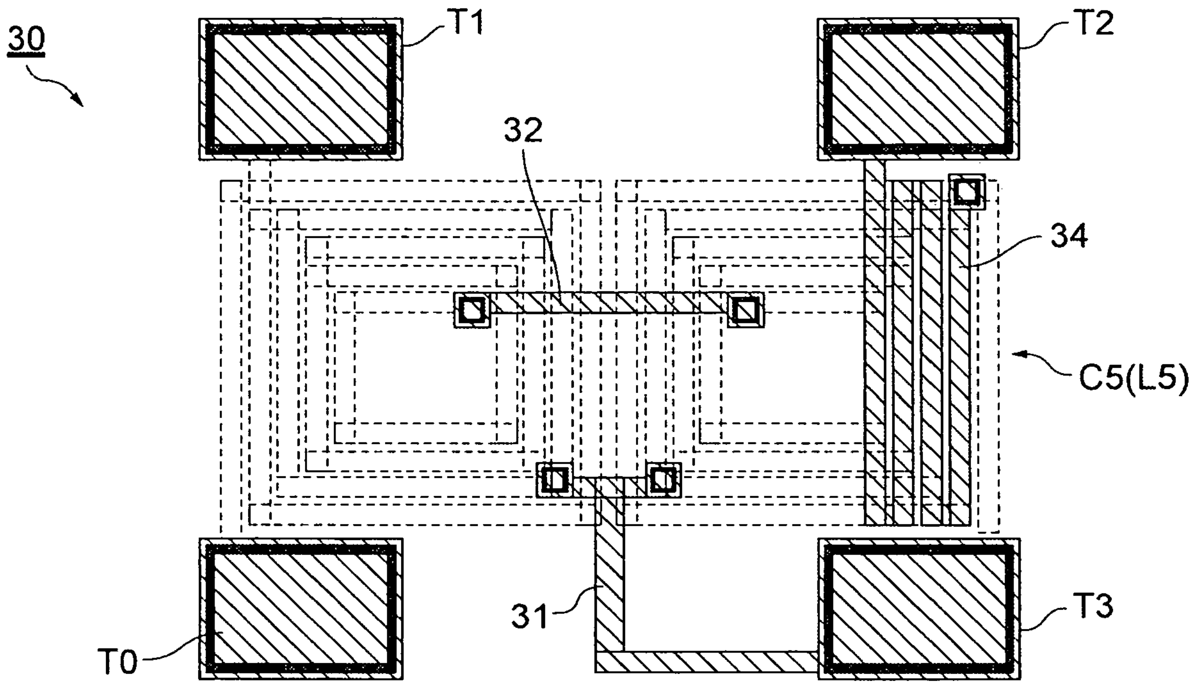
FIG. 21 is a plan view showing the third wiring layer 30 of the thin film balun 1 in an example 7.

In the example 7, the auxiliary coil portion C5 is made up of a meandering coil. FIG. 21 is a plan view showing the third wiring layer 30 of the thin film balun 1 in the example 7. Note that the first wiring layer 10 to the second wiring layer 20 in the example 7 have substantially the same structures as the example 1, except that the number of turns of the coil conductors on the lowermost first wiring layer is increased by 1. Besides, the fourth wiring layer 40 and the fifth wiring layer 50 of the example 1 are unnecessary in the example 7. Thus, the auxiliary coil portion C5 may be a zigzag line portion such as a meandering coil, as shown in FIG. 21.

As mentioned earlier, the present invention is not limited to the above embodiment, and various changes can be made to the present invention without departing from the scope of the present invention. For example, there is no specific limit in coil shape, so long as a part of the auxiliary coil portion C5 has a bend. Moreover, the auxiliary coil need not be wound one turn or more. For instance, the auxiliary coil may be wound a half turn. Furthermore, the winding direction may be in a plane different from a formation plane of the fourth coil portion, as in the case of a solenoid coil in which the auxiliary coil portion C5 is formed on a vertical plane. In addition, there is no limit to the placement of each of the terminals T0 to T3. Moreover, the wiring structure that forms the thin film balun 1 may be less than four layers, or five or more layers. Additionally, the layer structure may be completely reversed so that the first wiring layer 10 is formed at the uppermost layer and the fifth wiring layer 50 is formed at the lowermost layer. Furthermore, various coil arrangements may be employed without departing from the scope of the present invention.

The thin film balun according to the present invention can realize a thin film balun that has attenuation characterisitics in a desired frequency range while maintaining miniaturization, and therefore can be applied to wireless communication devices that are particularly required to be smaller in size.

What is claimed is:

1. A thin film balun comprising:

an unbalanced transmission line including a first coil portion and a second coil portion;

a balanced transmission line including a third coil portion and a fourth coil portion that are magnetically coupled to the first coil portion and the second coil portion, respectively;

a first balanced terminal connected to the third coil portion;

a second balanced terminal connected to the fourth coil portion; and an auxiliary coil portion where one end is connected to the third coil portion and the other end is connected to the first balanced terminal; or one end is connected to the fourth coil portion and the other end is connected to the second balanced terminal, wherein at least one part of the auxiliary coil portion overlaps a part of the third coil portion or a part of the fourth coil portion, and is positioned so as to face a coil opening of at least one of the first coil portion and the second coil portion.

2. The thin film balun as claimed in claim 1, wherein the auxiliary coil portion is connected between the fourth coil portion and the second balanced terminal.

3. The thin film balun as claimed in claim 1, wherein a winding direction of the auxiliary coil portion is opposite to a winding direction of the first coil portion and the second coil portion.

* * * * *